(12) United States Patent
Overweg et al.

(10) Patent No.: US 9,891,298 B2
(45) Date of Patent: Feb. 13, 2018

(54) AUTOMATIC CURRENT SWITCHING OF CURRENT LEADS FOR SUPERCONDUCTING MAGNETS

(71) Applicant: KONINKLIJKE PHILIPS N.V., Eindhoven (NL)

(72) Inventors: Johannes Adrianus Overweg, Hamburg (DE); Thomas Erik Amthor, Hamburg (DE); Peter Forthmann, Hamburg (DE); Falk Uhlemann, Hamburg (DE); Bernd David, Hamburg (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 15/688,047

(22) Filed: Aug. 28, 2017

(65) Prior Publication Data

US 2017/0356970 A1    Dec. 14, 2017

Related U.S. Application Data

(62) Division of application No. 14/375,354, filed as application No. PCT/IB2013/050333 on Jan. 14, 2013, now Pat. No. 9,746,533.
(Continued)

(51) Int. Cl.
  *H01F 1/00*    (2006.01)
  *G01R 33/36*   (2006.01)
  (Continued)

(52) U.S. Cl.
  CPC ......... *G01R 33/3642* (2013.01); *G01R 33/34* (2013.01); *G01R 33/3815* (2013.01);
  (Continued)

(58) Field of Classification Search
  CPC .. A61B 5/00; A61B 5/055; G21F 7/00; G01R 33/20; G01R 33/28; G01R 33/34; G01R 33/36; G01R 33/3642; G01R 33/385
  (Continued)

(56) References Cited

U.S. PATENT DOCUMENTS 4,544,979 A    10/1985  Ennis
4,893,083 A *   1/1990  Overweg ......... G01R 33/34046
                                                  324/318
(Continued)

FOREIGN PATENT DOCUMENTS

JP    6389212 U     6/1988
JP    33142621 A    6/1988
(Continued)

OTHER PUBLICATIONS

Tamai, Terutaka et al "Contact Resistance Characteristics at Low Temperature" IEEE Transactions on Components, Hybrids, and Manufacturing Technology, vol. CHMT-1, No. 1, Mar. 1978, pp. 54-58.
(Continued)

*Primary Examiner* — Shawki S Ismail
*Assistant Examiner* — Lisa Homza (57)    ABSTRACT

The invention provides for magnetic resonance imaging system (600) comprising a superconducting magnet (100) with a first current lead (108) and a second current lead (110) for connecting to a current ramping system (624). The magnet further comprises a vacuum vessel (104) penetrated by the first current lead and the second current lead. The magnet further comprises a magnet circuit (106) within the vacuum vessel. The magnet circuit has a first magnet circuit connection (132) and a second magnet circuit connection (134). The magnet further comprises a first switch (120) between the first magnet connection and the first current lead
(Continued)

and a second switch (122) between the second magnet connection and the second current lead. The magnet further comprises a first current shunt (128) connected across the first switch and a second current shunt (130) connected across the second switch. The magnet further comprises a first rigid coil loop (124) operable to actuate the first switch. The first rigid coil loop forms a portion of the first electrical connection. The magnet further comprises a second rigid coil loop (126) operable to actuate the second switch. The second rigid coil loop forms a portion of the second electrical connection.

20 Claims, 5 Drawing Sheets

Related U.S. Application Data (60) Provisional application No. 61/593,383, filed on Feb. 1, 2012.

(51) Int. Cl.
*H01F 6/06* (2006.01)
*G01R 33/3815* (2006.01)
*G01R 33/34* (2006.01)
*H01F 6/00* (2006.01)
*H01H 36/00* (2006.01)

(52) U.S. Cl.
CPC ............... *H01F 6/008* (2013.01); *H01F 6/06* (2013.01); *H01F 6/065* (2013.01); *H01H 36/008* (2013.01)

(58) Field of Classification Search
USPC ........................................................ 335/216
See application file for complete search history.

(56) References Cited

U.S. PATENT DOCUMENTS

| 4,982,571 | A | 1/1991 | Marschik et al. |
| 7,567,156 | B2 | 7/2009 | Westphal |
| 7,679,365 | B2 | 3/2010 | Du |
| 2002/0050820 | A1* | 5/2002 | Overweg ............ G01R 33/3806 324/318 |
| 2002/0072666 | A1* | 6/2002 | Overweg ............ G01R 33/3806 600/410 |
| 2005/0068032 | A1* | 3/2005 | Harvey .............. G01R 33/3806 324/318 |
| 2005/0204751 | A1 | 9/2005 | White |
| 2011/0237859 | A1* | 9/2011 | Kuhn .................. A61N 5/1031 600/1 |

FOREIGN PATENT DOCUMENTS

| KR | 2010026288 A | 3/2010 |
| WO | 2003002906 A1 | 1/2003 |

OTHER PUBLICATIONS

El Abdi, R. et al "Study of Contact Resistance for High Copper Alloys under Indentation and Insertion Forces", International Journal of Systems Applications, Engineering and Development, Issue 2, vol. 2, 2008, pp. 75-82.

* cited by examiner

AUTOMATIC CURRENT SWITCHING OF CURRENT LEADS FOR SUPERCONDUCTING MAGNETS

CROSS-REFERENCE TO PRIOR APPLICATIONS

This application claims the benefit or priority of and describes relationships between the following applications: wherein this application is a divisional of U.S. patent application Ser. No. 14/375,354, filed Jul. 29, 2014, which is the National Stage of International Application No. PCT/IB2013/050333, filed Jan. 14, 2013, which claims the priority of U.S. provisional application 61/593,383 filed Feb. 1, 2012, all of which are incorporated herein in whole by reference.

TECHNICAL FIELD

The invention relates to magnetic resonance imaging, in particular it relates to the automatic switching of current leads for ramping the current of a superconducting magnet.

BACKGROUND OF THE INVENTION

A magnetic field is used in Magnetic Resonance (MR) Imaging to align the nuclear spins of atoms as part of the procedure for producing images within the body of a patient. This magnetic field is referred to as the B0 field. During an MR scan, Radio Frequency (RF) pulses generated by a transmitter or amplifier and an antenna cause perturbations to the local magnetic field and can be used to manipulate the orientation of the nuclear spins relative to the B0 field. Radio Frequency (RF) signals emitted by the nuclear spins are detected by a receiver coil, and these RF signals are used to construct the MRI images.

The B0 field for magnetic resonance imaging is typically generated using a superconducting magnet. The current flowing in the coils of the superconducting magnet may be changed or ramped up or down using an external power supply, load, or discharge system by connecting to current leads connected to the coils of the superconducting magnet.

SUMMARY OF THE INVENTION

The invention provides for a magnetic resonance imaging system, a magnet and a switch assembly in the independent claims. Embodiments are given in the dependent claims.

A difficulty in connecting current leads to a superconducting magnet is that good conductors of electricity are typically good thermal conductors. Current leads may therefore warm the superconducting magnet. This may increase the energy requirements of operating the superconducting magnet. It may therefore be advantageous to provide a system of connecting or disconnecting the current leads from the magnets.

Connecting and disconnecting the current leads from the coils of the superconducting magnet may be challenging. The switches may need to be able to function in a vacuum and/or at cryogenic temperatures. Additionally, it is beneficial if they function properly if the power fails or if the magnet begins to quench.

Embodiments of the invention may solve the aforementioned problems and other problems by providing a mechanical system that automatically switches the current leads connecting to the superconducting coils or magnet circuit.

The invention relates to a magnetic resonance examination system comprising a set of superconducting main magnet coils disposed in a cryogenic vessel. An electrical connection is provided between the superconducting coils and a current drain outside of the cryogen vessel. An electrical switch is provided in the electrical connection. According to the invention, the electrical connection includes a low current capacity shunt, a U-shaped, or other shaped, conductor that is movably (possibly rotatable) mounted between the magnet frame and a contact port in electrical correspondence with the superconducting coils. The low current capacity shunt connects the contact port to the U shaped conductor. The U shaped conductor has a contact port that can be moved against the contact port on the magnet frame (so as to form a pin/anvil contact). The U shaped conductor is moved by the Lorentz force when current flows via the shunt into the U shaped contactor.

The invention enables to automatically close the switch formed by the contact ports when the current in the main magnet is ramped up or down.

This invention disclosure describes a system of permanently installed current leads for a refrigerated superconducting magnet, for example used in an MRI scanner, causing very small heat leak into the cold parts of the magnet. The key feature of these leads is a fully automatic mechanical switch between the states of low and high electrical/thermal impedance, actuated by the Lorentz force on the transport current flowing through the lead. This switching action reduces the heat load on the first refrigerator stage by at least an order of magnitude.

A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network.

'Computer memory' or 'memory' is an example of a computer-readable storage medium. Computer memory is any memory which is directly accessible to a processor. Examples of computer memory include, but are not limited to: RAM memory, registers, and register files.

'Computer storage' or 'storage' is an example of a computer-readable storage medium. Computer storage is any non-volatile computer-readable storage medium. Examples of computer storage include, but are not limited to: a hard disk drive, a USB thumb drive, a floppy drive, a smart card, a DVD, a CD-ROM, and a solid state hard drive. In some embodiments computer storage may also be computer memory or vice versa.

A 'computing device' as used herein encompasses to any device comprising a processor. A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses a interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

Magnetic Resonance (MR) data is defined herein as being the recorded measurements of radio frequency signals emitted by atomic spins by the antenna of a Magnetic resonance apparatus during a magnetic resonance imaging scan. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a magnetic resonance imaging system comprising a magnet for generating a magnetic field. The magnet is a superconducting magnet. The magnet has a first current lead and a second current lead. The magnetic resonance imaging system further comprises a current ramping system configured for attaching to the first current lead and the second current lead. The current ramping system is operable for ramping the current of the superconducting magnet. Ramping as used herein encompasses the process of changing the current flowing through a superconducting magnet. This may include increasing and/or decreasing the current flowing through the coils of a superconducting magnet. The current ramping system is operable for ramping the current of the superconducting magnet.

The magnet further comprises a vacuum vessel. The first current lead and the second current lead are located on an exterior surface of the magnet and penetrate the vacuum vessel. In other words the first current lead and the second current lead provide current feed-throughs into the vacuum vessel. The magnet further comprises a magnet circuit for generating the magnetic field. The magnet circuit comprises the coils of superconducting material used for generating the magnetic field. The magnetic circuit is within the vacuum vessel. The magnet further comprises a first magnet circuit connection. The magnet further comprises a second magnet circuit connection. The first magnet circuit connection and the second magnet circuit connection provide an electrical connection to the magnet circuit for ramping the magnet circuit. Essentially the first and second magnet circuit connections are electrical connections to the coils of the magnet.

The magnet further comprises a first switch for switching a first electrical connection between the first magnet connection and the first current lead. The magnet further comprises a second switch for switching a second electrical connection between the second magnet connection and the second current lead. The magnet further comprises a first current shunt connected across the first switch. The magnet circuit further comprises a second current shunt connected across the second switch. The magnet further comprises a first rigid coil loop. The first rigid coil loop is operable to actuate the first switch. The first rigid coil loop forms a portion of the first electrical connection. The magnet further comprises a second rigid coil loop. The second rigid coil loop is operable to actuate the second switch. The second rigid coil loop forms a portion of the second electrical connection.

The first and second rigid coil loops are moveable and are able to activate the first and second electrical connections respectively. Within the vacuum vessel there may be a magnetic field generated by the magnet. When a current begins to flow through the first and second current shunt the current also flows through the first rigid coil loop and the second rigid coil loop. This may induce a magnetic field by the first and second rigid coil loops which may interact with the magnetic field generated by the magnet. This may then cause the actuation of the first and second switch. This embodiment may be advantageous because it may provide an automatic way of switching the first switch and the second switch.

In some embodiments the first and second current shunts are able to conduct a current level much lower than the first switch and the second switch. However the shunts, because they have lower electrical conductivity, very likely have a higher thermal conductivity also. A current can be passed through the first current lead and the second current lead which is then conducted by the first current shunt and the second current shunt. When the current becomes large enough this causes a force between the first rigid coil loop and the magnetic field and the second rigid coil loop and the magnetic field. This may cause an actuation of the first switch and the second switch to occur.

In another embodiment each of the first rigid coil loop and the second rigid coil loop are only half loop coils.

In another embodiment the first switch and the second switch are thermally isolating.

In another embodiment the first rigid coil loop and the second rigid coil loop move independently. For instance the first rigid coil loop and the second rigid coil loop may be mounted on separate bearings and the first switch and the second switch are therefore actuated independently.

In another embodiment the first rigid coil loop and the second rigid coil loop are both mounted on the same rigid structure. For instance when the current is flowing through both the first rigid coil loop and the second rigid coil loop the coils can be arranged such that they exert a torque on the rigid structure in the same direction. This embodiment may be advantageous because it reduces the number of bearings needed to be maintained within the vacuum vessel.

In another embodiment the magnet may normally be operated in a persistent mode.

In another embodiment the current ramping system may either ramp-up or increase the current and/or it may ramp-down or decrease the current.

In another embodiment the current ramping system may ramp the current during a ramp-down for maintenance, a magnet quench, and ramp-up of the current to regular system operation.

In another embodiment the first current shunt and/or the second current shunt may be flexible. This may be advantageous because it enables the shunts to flex or bend during the actuation of the first switch and the second switch.

In another embodiment the room temperature terminals that are the first and second current leads are joined by the first current shunt and the second current shunt respectively to the first and second magnet circuit connections. The first current shunt and the second current shunt may be low-impedance electrical conductions operable for carrying the operating current of the magnet. For ramping-up the magnet a high current power supply may be attached between the first and second current leads. Ramping-down the magnet a resistance or diode circuit may be connected across the first current lead and the second current lead. In some embodiments the resistance or diode may be sized or chosen such that the magnet energy is dissipated over time of 0.2 to 2 hours.

In another embodiment the first switch comprises a first pivot for pivoting the first rigid coil loop. The first switch is formed by a first contact and a second contact. The first rigid coil loop is operable for closing the first contact and the second contact by pivoting. The second switch comprises a second pivot for pivoting the second rigid coil loop. The second switch is formed by a third contact and a fourth contact. The second rigid coil loop is operable for closing the third contact and the fourth contact by pivoting. This embodiment may be beneficial because it provides a simply designed but efficient means of switching the first switch and the second switch within the vacuum vessel.

In another embodiment the first switch is formed by a first linkage comprising the first rigid coil loop. The second switch is formed by a second linkage comprising the second rigid coil loop. In this embodiment essentially the first rigid coil loop and the second rigid coil loop each activate linkages which form as a lever. This may be beneficial because a better electrical connection is formed when the first switch and the second switch are each closed.

In another embodiment the first switch is formed by a first screw mechanism. The first rigid coil is operable for actuating the first screw mechanism. The second switch is formed by a second screw mechanism. The second rigid coil is operable for actuating the second screw mechanism. In this embodiment the first rigid coil loop and the second coil loop may be actuated by current flowing through them which causes them to rotate on a pivot or bearing. This rotational motion may be used to drive a screw mechanism or mechanisms which may then be used to close the first switch and the second switch.

In another embodiment the first switch is thermally isolating. The first switch is attached to the first current lead. The second switch is thermally isolating. The second switch is attached to the second current lead. This embodiment may be advantageous because the first current lead and the second current lead have electrical connections outside of the vacuum chamber. This means that they may be at room temperature. As they are good conductors they may also be very good thermal conductors. By having the first switch and the second switch being thermally isolated this prevents the first current lead and the second current lead from warming the magnet circuit.

The first switch and the second switch may have a low thermal conductivity when they are in an "off" or open state. The switches may have a higher thermal conductivity in their "on" or closed state.

In another embodiment the first switch is electrically connected to the first magnet connection with a first high-temperature superconductor. The second switch is electrically connected to the second magnet connection with a second high-temperature superconductor. The first magnet circuit connection comprises a high-temperature superconductor. The second magnet circuit connection comprises a high-temperature superconductor. This embodiment may be beneficial because there may be a thermal gradient across the first switch and/or the second switch. The first high-temperature superconductor and the second high-temperature superconductor may be used to provide an additional thermal mass with a thermal gradient across it. Because the first high-temperature superconductor and the second high-temperature superconductor are made from high-temperature superconductors they are able to be superconducting at a higher temperature than if they were for instance made out of low-temperature superconductors.

In some embodiments the magnet circuit comprises a low-temperature superconductor. In this case the first high-temperature superconductor and the second high-temperature superconductor in the aforementioned embodiment may be particularly beneficial because the thermal gradient across the first high-temperature superconductor and the second high-temperature superconductor may reduce the loss of thermal energy by the low-temperature superconductor.

In another embodiment the magnet further comprises at least one restoring element operable for maintaining the position of the first rigid coil loop such that the first switch remains open and for maintaining the position of the second rigid coil loop such that the second switch remains open when the current flowing between the first current lead and the second current lead is below a predetermined threshold. This embodiment may be beneficial because the restoring element may be chosen to select at which current level the first switch and the second switch close. In some embodiments each of the rigid coil loops has their own restoring element. The restoring element or elements can have a strength adjustor to change at what current levels the first switch and the second switch will close. In some embodiments one or more of the restoring elements are springs, they may also be weights connected to the rigid coil loops by cables and a pulley. The restoring element may also be an automatically actuated or manually actuated actuator. For instance the actuator could be a stepper motor designed to keep the first switch and the second switch open.

In another embodiment the first rigid coil loop comprises multiple coil loops. The second rigid coil loop comprises multiple coil loops. This embodiment may be beneficial because the additional coil loops cause each of the coils to generate a larger magnetic field when current passes through them. This may cause more torque to form on the coils which makes it easier to actuate the first switch and the second switch.

In another embodiment at least one of the first rigid coil loop and the second rigid coil loop is attached to an iron block. This embodiment may be beneficial because it increases the amount of force generated by the first rigid coil loop and/or the second rigid coil loop when a current passes through it.

In another embodiment at least one of the first rigid coil loop and the second rigid coil loop is operable to move within a gap of an iron block attached within an interior surface of the vacuum vessel. This embodiment may be beneficial because it may increase the amount of torque generated by the first rigid coil loop and/or the second rigid coil loop and make it easier to actuate the first switch and/or the second switch.

In some embodiments both rigid coil loops could have their own iron block or pass through their own iron block with a gap.

In another embodiment the first switch comprises a first cold terminal electrically connected to the first magnetic connection. The second switch comprises a second cold terminal electrically connected to the second magnet connection. The first cold terminal and the second cold terminal are thermally connected to a refrigerated radiation shield. This embodiment may be beneficial because the refrigerated radiation shield may provide a heat reservoir which prevents the first switch and the second switch from warming too much when the current in the magnet is ramped.

In another embodiment the first switch and the second switch are mounted adjacent to a refrigerator stem for cooling the magnet circuit. Again this may be beneficial because the refrigerator stem may provide a thermal reservoir which reduces the warming of the first switch and the second switch during a ramping process.

In another embodiment the magnetic field has field lines. The first rigid coil loop is oriented relative to the magnetic field such that a first predetermined switching current through the first rigid coil loop is operable for generating a first torque on the first rigid coil loop for actuating the first switch. The second rigid coil loop is oriented relative to the magnetic field lines such that a second predetermined switching current through the second rigid coil loop is operable for generating a second torque on the second rigid coil loop for actuating the second switch.

In another embodiment the first and second rigid current loops are located in a region where a significant axially directed magnetic field appears if the magnet is on. The combined effect of this magnetic field on the current through the loops is to generate a lateral electromagnetic force. This lateral electromagnetic force may be used for actuating the first switch and/or the second switch.

In another embodiment the magnet further comprises at least one heat shield at least partially surrounding and/or in contact with the first switch and the second switch. This embodiment may be beneficial because the at least one heat shield provides a thermal reservoir which may help to keep the first switch and the second switch cold during the ramping of current in the magnet circuit.

In some embodiments the heat shield or shields may be cooled by the refrigerator stem yet there may be multiple heat shields. In some embodiments the heat shield or shields may be aluminum plates that function as a heat reservoir during the ramping-up or down of current.

In another aspect the invention provides for a magnet for generating a magnetic field. The magnet is a superconducting magnet. The magnet comprises a first current lead. The magnet further comprises a second current lead. The magnet further comprises a vacuum vessel. The first current lead and the second current lead are located on an exterior surface of the magnet and penetrate the vacuum vessel. The magnet further comprises a magnet circuit for generating the magnetic field. The magnet circuit is within the vacuum vessel. The magnet further comprises a first magnet circuit connection. The magnet further comprises a second magnet circuit connection. The first magnet circuit connection and the second magnet circuit connection provide an electrical connection for the magnet circuit for ramping of the current in the magnet circuit.

The magnet further comprises a first switch for switching a first electrical connection between the first magnetic connection and the first current lead. The magnet further comprises a second switch for switching a second electrical connection between the second magnet connection and the second current lead. The magnet further comprises a first current shunt connected across the first switch. The magnet further comprises a second current shunt connected across the second switch. The magnet further comprises a first rigid coil loop. The first rigid coil loop is operable to actuate the first switch. The first rigid coil loop forms a portion of the first electrical connection. The magnet further comprises a second rigid coil loop. The second rigid coil loop is operable to actuate the second switch. The second rigid coil loop forms a portion of the second electrical connection.

In another aspect the invention provides a switch assembly for a magnet for generating the magnetic field. The magnet comprises a first current lead. The magnet further comprises a second current lead. The magnet further comprises a vacuum vessel. The first current lead and the second current lead are located on an exterior surface of the magnet and penetrate the vacuum vessel. The magnet further comprises a magnet circuit for generating the magnetic field. The magnet circuit is within the vacuum vessel.

The magnet further comprises a first magnet circuit connection. The magnet further comprises a second magnet circuit connection. The first magnet circuit connection and the second magnet circuit connection provide an electrical connection to the magnet circuit. The switch assembly comprises a first switch for switching a first electrical connection between the first magnet connection and the first current lead. The switch assembly further comprises a second switch for switching a second electrical connection between the second magnet connection and the second current lead. The switch assembly further comprises a first current shunt connected across the first switch. The switch assembly further comprises a second current shunt connected across the second switch. The switch assembly further comprises a first rigid coil loop. The first rigid coil loop is operable to actuate the first switch. The first rigid coil loop forms a portion of the first electrical connection. The switch assembly further comprises a second rigid coil loop. The second rigid coil loop is operable to actuate the second switch. The second rigid coil loop forms a portion of the second electrical connection.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
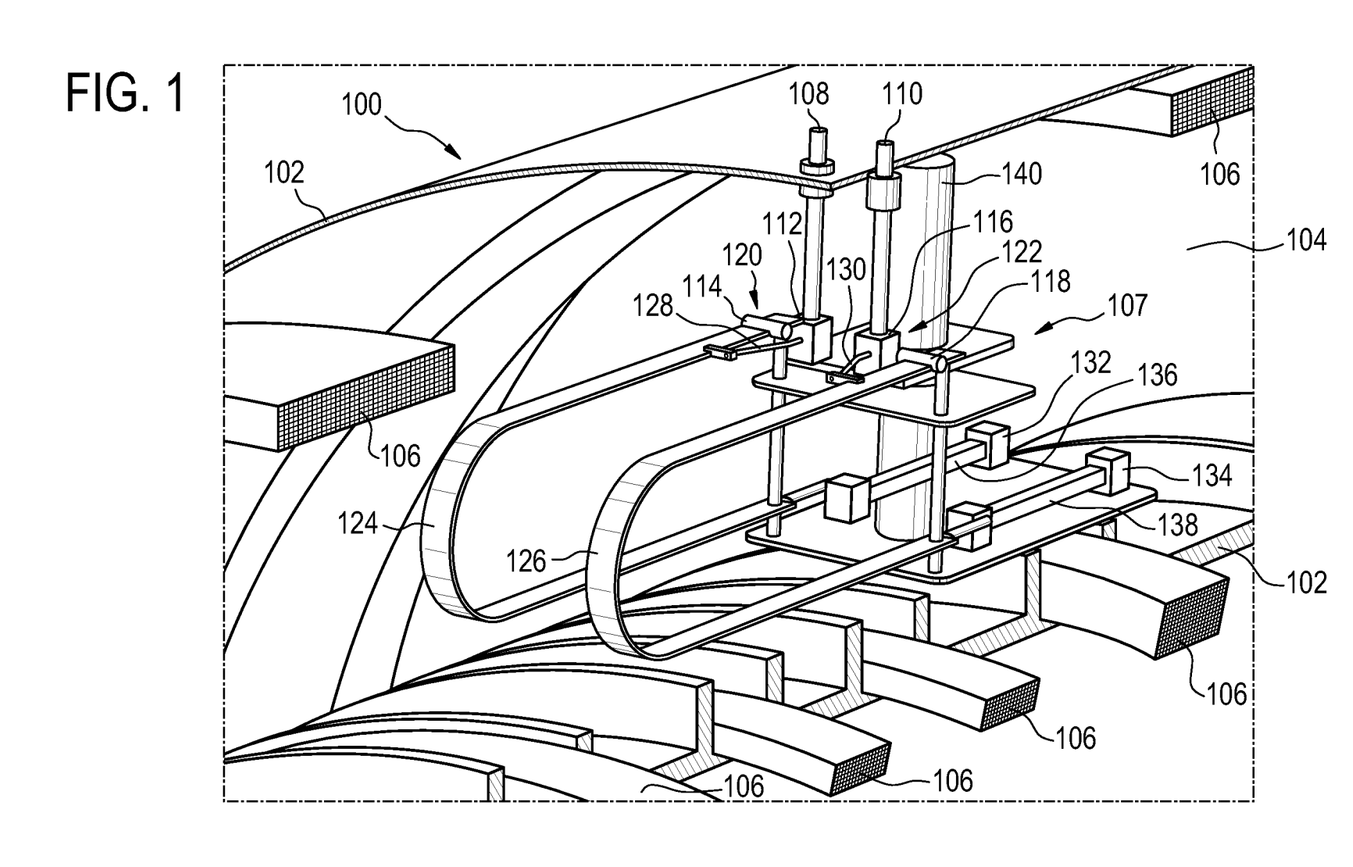
FIG. 1 illustrates a magnet 100 according to an embodiment of the invention

FIG. 1 illustrates an example of a magnet 100 according to an embodiment of the invention. This is a portion of a cylindrical-type magnet. There are visible vacuum chamber walls 102. This magnet has a cylindrical-type bore in the middle. Between the walls 102 there is a vacuum chamber 104. The elements labeled 106 are portions of superconducting coils which form the magnet circuit 106.

There is a switch assembly 107 mounted within the vacuum chamber 104. There is a first current lead 108 and a second current lead 110 which go through the wall 102 and provide an electrical feed-through. The first current lead 108 is connected to a first contact 112. The second current lead 110 is connected to a third contact 116. There is a second contact 114 that forms a first switch 120. There is a fourth contact 118 which forms a second switch 122. In this embodiment the second contact 114 is mounted on a first rigid coil loop 124. The fourth contact 118 is mounted on a second rigid coil loop 126. The first rigid coil loop 124 and the second rigid coil loop 126 are each able to pivot and by pivoting bring the first contact in contact with the second contact 114 or bring the third contact 116 in contact with the fourth contact 118. Additionally there is a first current shunt 128 between the first rigid coil loop 124 and the first contact 112. There is a second current shunt 130 which connects the second rigid coil loop 126 to the third contact 116.

When the magnet 100 is in use there are currents flowing through the magnet circuit 106. This induces a magnetic field which is also present within the vacuum chamber 104. When a current flows between the first current lead 108 and the second current lead 110 the current is also able to flow through the first 128 and second 130 current shunts. If the current flowing through the shunts is sufficient the current flowing through the first rigid coil loop 124 and the second rigid coil loop 126 will cause a magnet field which due to the magnetic field generated by the magnet circuit 106 will induce a torque which causes the first switch 120 and the second switch 122 to close. A difficulty with providing a direct connection from the first current lead 108 and second current lead 110 is that good conductors are typically also very good thermal conductors. This would lead to a large thermal loss and increase the load on the refrigeration system for cooling the magnet circuit 106. This may be solved by using a switching arrangement where the first 108 and second 110 current leads are switched and then connected to the magnet circuit 106. A difficulty is that it may be difficult to operate such a switch when a power failure or other emergency is occurring with the magnetic resonance imaging system. The switch assembly 107 as depicted here will automatically close the first switch 120 and the second switch 122 when the current flowing through the first rigid coil 124 and the second rigid coil 126 is sufficient.

Exactly the amount of current necessary to control when the first switch 120 and second switch 122 close may be performed by adding restoring elements. They are not depicted in this Fig. but it is relatively straight forward to add springs or other restoring elements to control the amount of force necessary to close the first switch 120 and the second switch 122.

Also depicted in this Fig. is shown a first magnet connection 132 and a second magnet connection 134. These are electrical connections which provide electrical connection to the magnet circuit 106. In this embodiment a first high-temperature superconductor 136 is used to connect the first rigid coil loop 124 to the first magnet connector 132. A second high-temperature superconductor 138 is used to connect the second rigid coil loop 126 to a second magnet connection 134. The first high-temperature superconductor and the second high-temperature superconductor 136, 138 provide a place where a thermal gradient can exist between the first magnet connection 132 and the first rigid coil loop 124 and another thermal gradient between the second magnet connection 134 and the second rigid coil loop 126.

Because the first high-temperature superconductor 136 and the second high-temperature superconductor 138 are made from high-temperature superconducting materials the resistive loss in these components will be minimal. The presence of the first high-temperature superconductor 136 and the second high-temperature superconductor 138 is not necessary in all embodiments. However, the presence of the first high-temperature superconductor 136 and the second high-temperature superconductor 138 may be more beneficial in the case when the magnet circuit 106 is manufactured from low-temperature superconductors. This is because there may be a higher temperature difference between the magnet circuit 106 and components of the switch assembly 107.

The switch assembly 107 is shown as being adjacent to a refrigerator stem 140. Placing the refrigerator stem 140 in the vicinity of the switch assembly 107 may be beneficial because when the current in the magnet circuit 106 is being ramped that is decreased or decreased, resistive heating may cause various components of the switch assembly 107 to warm. The refrigerator stem 140 may provide a thermal reservoir helping to prevent the temperature of the components of the switch assembly 107 from rising. Not shown in this diagram, however a heat shield can be placed or heat shields can be placed around various components of the switch assembly 107. Due to their close location to the refrigerator stem 140 these heat shields may also provide additional thermal reservoir during ramping.

Refrigerated MRI magnets without a large liquid helium buffer, such as depicted in FIG. 1, may be equipped with an automatic ramp-down system to switch off the magnetic field in case of a prolonged malfunction of the cooling system before the magnet has warmed too much.

In order to enable a safe ramp-down, the current leads connecting the superconducting coil to the outside world need to be in place at all times. The leads must be capable of carrying the full magnet current without cooling by helium gas evaporating from the magnet. Such permanent leads would, however, result in a heat load on the first stage of the refrigerator of the order of 20 W (for a typical magnet operating current of 400 A). This is too much to be acceptable. In principle the desired low heat leak in the situation that no current is flowing can be obtained by mechanically disconnecting the leads from the cold mass. However, a reliable mechanical actuator performing a switching action inside the vacuum space, also in a situation where the mains power is not available is not easily obtained.

The current leads 108, 110 may provide the desired switching action of the leads in a fully passive way by making use of the Lorentz force on the lead current in the magnetic field generated by the magnet itself.

As illustrated in FIG. 1, each of the two current leads 108, 110 consists of a fixed penetration of the outer vacuum container housing the magnet coils, connected to a U-shaped swiveling part 124, 126 through an electrical/thermal contact. The contact gap is bridged by a thin flexible wire 128, 130 which in some embodiments may be capable of carrying up to 10% of the maximum current. At the other end, the U-shaped swiveling part of the lead is connected (in a flexible way) to the magnet circuit 106, either directly or with an intermediate high-temperature superconducting lead 132, 138. The swiveling parts of the current leads may be spring-loaded in such a way that the contacts are normally open. A current flowing in the magnet circuit will initially flow through the thin bypass bridging the contact gap. Since the U-shaped swiveling parts 124, 126 are exposed to the magnetic field in the annular gap 107 between the magnet's main and shield windings, they will be pulled sideways, in such a way that the contacts close, thereby making a low-resistance electrical connection between the fixed and swiveling parts of the lead. As soon as the current is reduced to zero the contacts open automatically.

This relay or automatic switch contact can in principle be implemented either on the high-temperature side or on the low-temperature side of the current lead. Since it has been shown that the contact resistance can increase significantly at low temperatures, it may be advantageous to place it at the high-temperature side where the contact temperature will be close to room temperature at all times.

Figure 2:
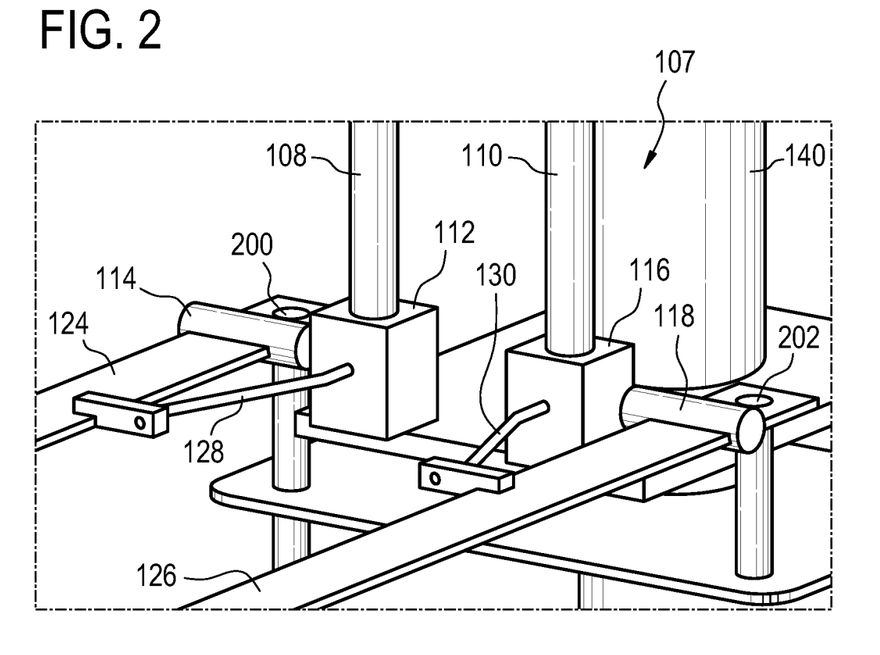
FIG. 2 illustrates a switch assembly according to an embodiment of the invention.

FIG. 2 shows a Fig. which illustrates greater detail of the switch assembly 107. In addition of the features shown in FIG. 1, a first bearing 200 about which the first rigid coil can rotate is shown. A second bearing 202 about which the second rigid coil loop 126 can rotate is also shown.

Figure 3:
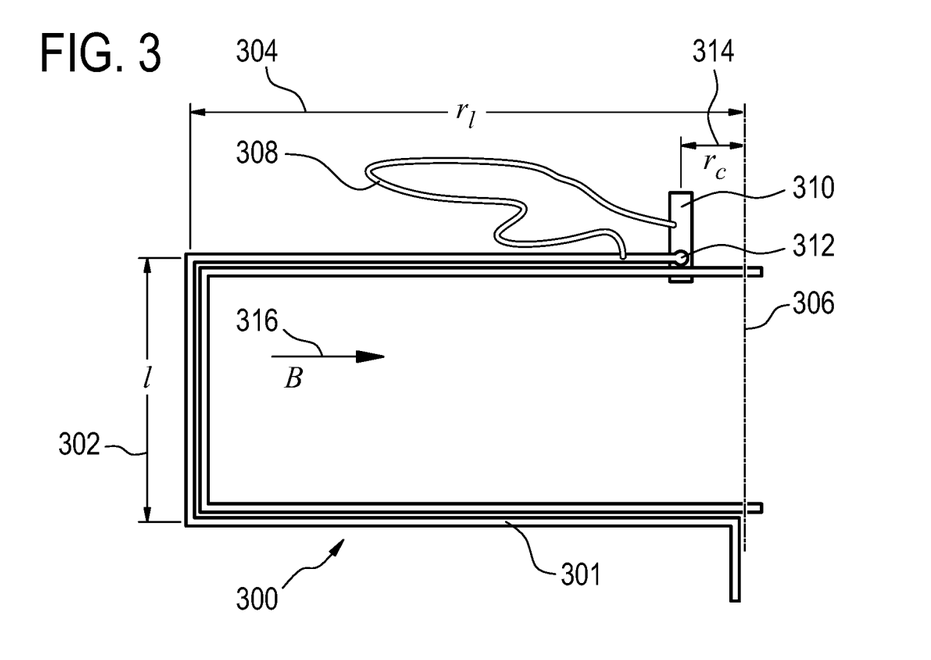
FIG. 3 illustrates an idealized switch assembly according to an embodiment of the invention.

FIG. 3 shows an idealized switch assembly 300 according to an embodiment of the invention. There is a rigid current loop 301 which is able to rotate about axis of rotation 306. The rigid current loop 301 has a height labeled 302 and a length or radius labeled 304. The switch is formed by a first contact 310 and a second contact 312. There is a bypass connection 308 between the first contact 310 and the rigid current loop 301. The first and second contact 310, 312 are mounted at a radius 314 from the axis of rotation 306. When a current passes through the rigid current loop 301 it causes a torque which causes the rigid current loop 301 to rotate about the axis of rotation 306. This causes a force between the second contact 312 and the first contact 310.

The dependence of the contact resistance $R_C$ on the force $F_C$ acting on the contact can be approximated as:

$$R_C = K_C F_C^{-n},$$

with n=0.3 . . . 0.4 and $K_C$=0.3 . . . 0.8 mΩ N$^n$ for copper according to [El Abdi et al.].

In this simulation, we use n=0.25 and $K_C$=0.2 mΩ N$^n$. These values have been determined experimentally. We assume the contact to be completely open for I<5 A and assign the above contact resistance for I>5 A. The Lorentz force F on the outer part of the conductor depends quadratically on the current I, since the magnetic field B is proportional to $$F = B(I)Il,$$

where l is the length of the outer part of the conductor aligned perpendicular to the magnetic field and B(I)=1 T*I/400 A, so that a maximum of 1 T is reached at I=400 A.

Figure 4:
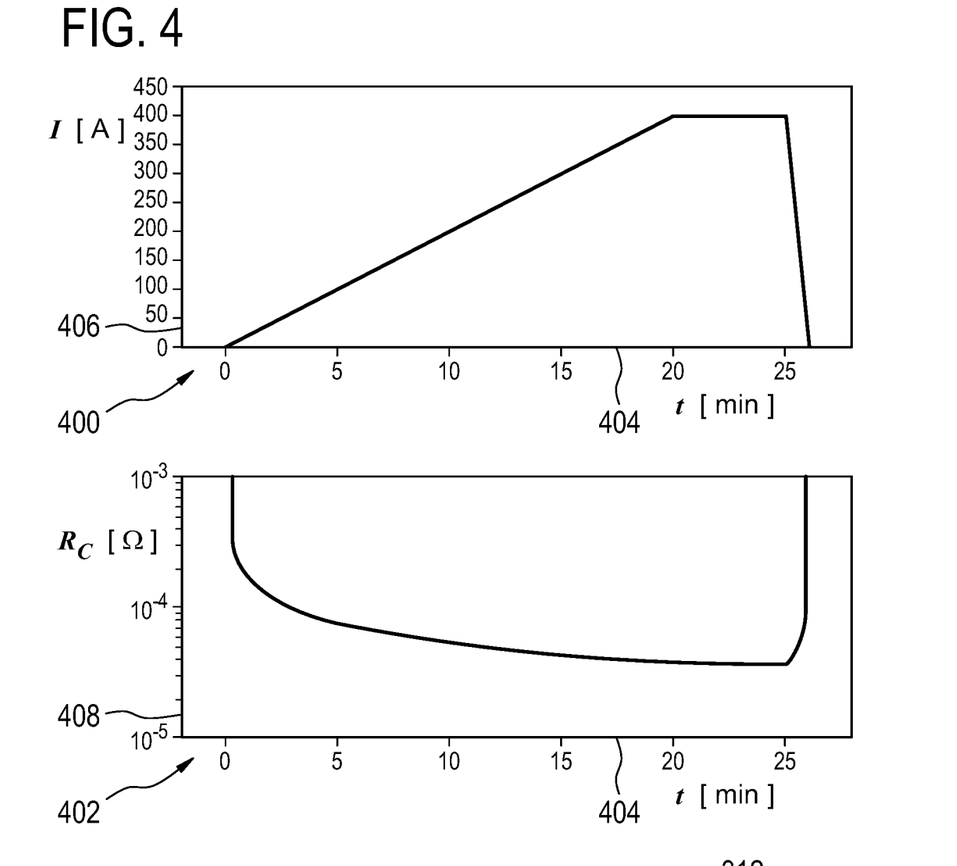
FIG. 4 a plot of the current loading of a magnet versus time and a plot of the contact resistance versus time for a switch assembly according to an embodiment of the invention.

Finally, due to the mechanics of the lever, $$F_C = \frac{r_l}{r_C} F,$$

where $r_l$ and $r_C$ are the radii of the outer conductor part and the contact, respectively. The expected contact resistance for a realistic geometry is plotted in FIG. 4 in plot 402 as a function of time, assuming the current pulse shown in FIG. 4 plot 400.

FIG. 4 shows two plots: Plot 400 shows the current loading of a magnet versus time and plot 402 shows the contact resistance versus time for a simulation. In both cases the x-axis is the time 404. The axis 406 shows the current load across the first and second current leads and the axis 408 shows the contact resistance of the first or second switch as a function of time also.

According to the simulation of the current lead shown in FIG. 4, a possible configuration transfers about 24 kJ of heat to the cold end of the wire during a loading sequence with only about 1 W heat load when the current is switched off.

In another embodiment, there is a thread integrated on the axis of rotation of the lever. The contact is realized by a thread bolt turned by the motion of the lever. In this way, the contact force can further be increased. A disadvantage of this technique may be the risk for jamming of the thread, such that the contact may not open reliably when the current is switched off.

The contact resistance can further be reduced when the two parts in contact are shifted sideways while the contact pressure is being applied. Tiny scratches on the surfaces produced by this procedure improve the electrical contact. In one embodiment a piece of bimetal attached to one or both of the contact parts induces this perpendicular displacement as soon as the temperature in the contact area increases because of the heat produced by the electrical current at the contact (I2RC). Heat is produced only when the contact is already closed, so that contact pressure will always be applied before the sideways movement sets in.

Figure 5:
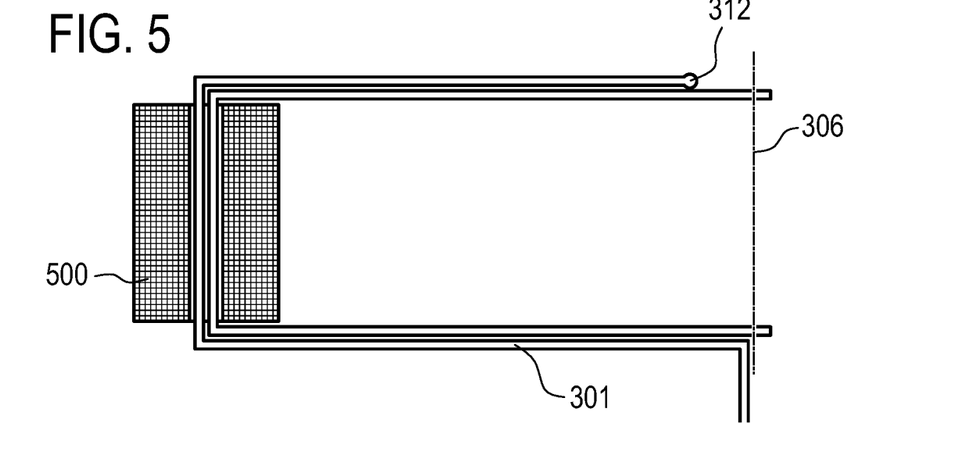
FIG. 5 illustrates an idealized switch assembly 300 according to a further embodiment of the invention.

FIG. 5 shows an embodiment similar to that shown in FIG. 3. Not all the components of FIG. 3 are illustrated in FIG. 5. In FIG. 5 only the rigid current loop 301 is shown. The rigid current loop 301 is able to rotate about the axis of rotation 306. In addition is shown a region labeled 500 which represents an iron or ferromagnetic component. The iron 500 may either be directly attached to the rigid current loop 301 or it may be a fixed piece of iron 508 with a channel through which the rigid current loop 301 can rotate. The purpose of the iron 500 is to create a greater torque about the axis of rotation 306 when a current flows through the rigid current loop 301.

In this embodiment, the force acting on the lever is increased by placing two blocks of iron to both sides of the conductor in such a way that the magnetic field is increased between the blocks. The idea is sketched in FIG. 3.

Calculations using the simulation software Opera suggest that under realistic conditions the contact pressure can be increased by about a factor of 2. At high fields, when the magnetization of the iron blocks is saturated, the effect will be smaller.

Ideally, the only forces acting on the swiveling current leads parts are the Lorentz force due to the magnetic field and the spring load pushing the lead back to the disconnected position. If the magnet is not perfectly leveled, however, there is an additional force due to gravity. This gravity force can be balanced by adding an additional mass on the opposite side of the swivel point, sized and positioned in such a way that the net torque due to gravity is zero. The current leads will then continue to work in all orientations of the magnet and also in case the magnet experiences acceleration/deceleration forces (for example during transit at field in a mobile MR system).

Figure 6:
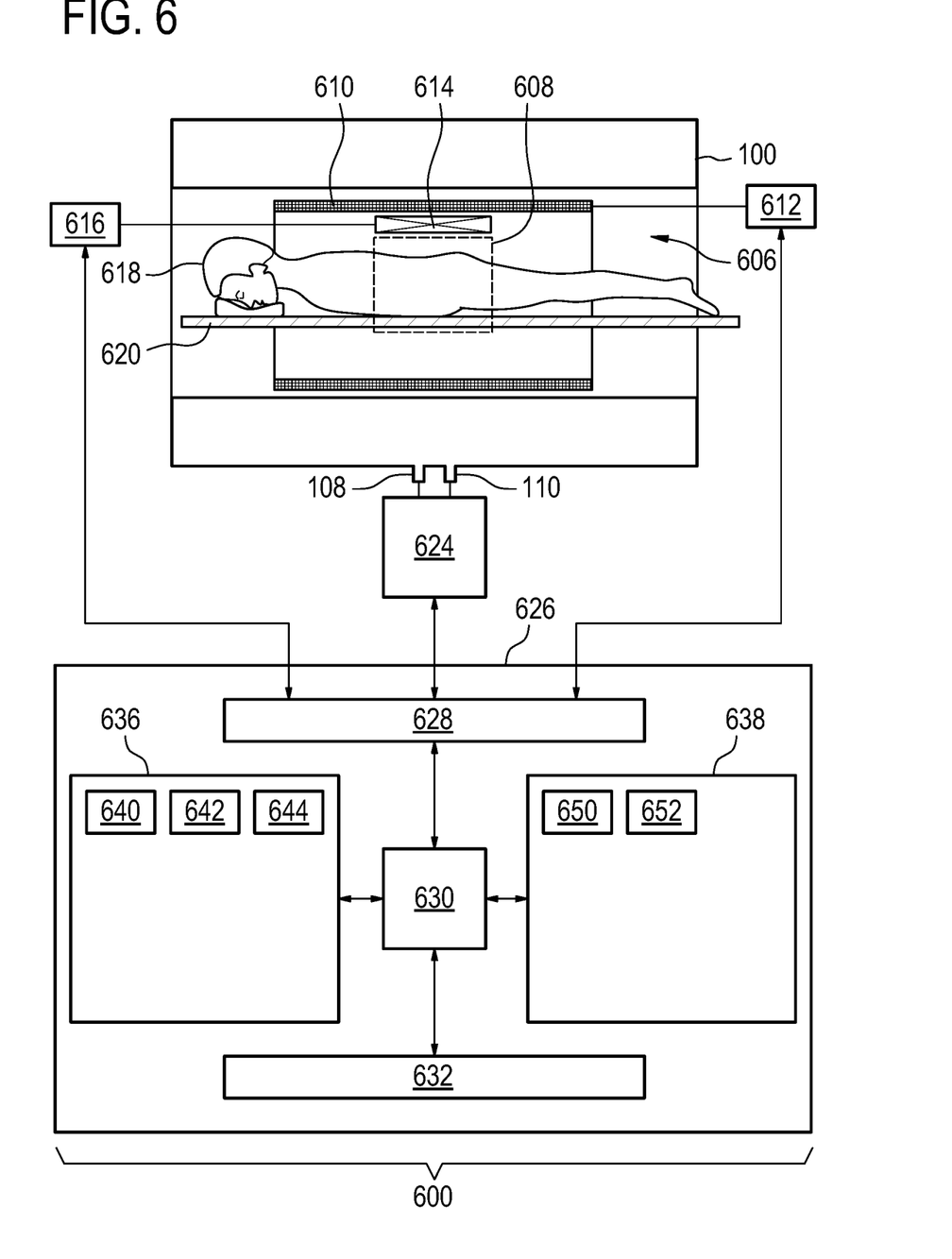
FIG. 6 illustrates a magnetic resonance imaging system according to an embodiment of the invention.

FIG. 6 illustrates an example of a magnetic resonance imaging system 600 according to an embodiment of the invention. The magnetic resonance imaging system 600 comprises a magnet 100. The magnet 100 is a superconducting cylindrical type magnet 100 with a bore 306 through it. The magnet 100 is designed as is depicted in FIG. 1. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 606 of the cylindrical magnet 100 there is an imaging zone 608 where the magnetic field is strong and uniform enough to perform magnetic resonance imaging.

Within the bore 606 of the magnet there is also a set of magnetic field gradient coils 610 which is used for acquisition of magnetic resonance data to spatially encode magnetic spins within the imaging zone 608 of the magnet 100. The magnetic field gradient coils 610 connected to a magnetic field gradient coil power supply 612. The magnetic field gradient coils 610 are intended to be representative. Typically magnetic field gradient coils 610 contain three separate sets of coils for spatially encoding in three orthogonal spatial directions. A magnetic field gradient power supply supplies current to the magnetic field gradient coils. The current supplied to the magnetic field gradient coils 610 is controlled as a function of time and may be ramped or pulsed.

Adjacent to the imaging zone 608 is a radio-frequency coil 614 for manipulating the orientations of magnetic spins within the imaging zone 608 and for receiving radio transmissions from spins also within the imaging zone 608. The radio frequency antenna may contain multiple coil elements. The radio frequency antenna may also be referred to as a channel or antenna. The radio-frequency coil 614 is connected to a radio frequency transceiver 616. The radio-frequency coil 614 and radio frequency transceiver 616 may be replaced by separate transmit and receive coils and a separate transmitter and receiver. It is understood that the radio-frequency coil 614 and the radio frequency transceiver 616 are representative. The radio-frequency coil 614 is intended to also represent a dedicated transmit antenna and a dedicated receive antenna. Likewise the transceiver 616 may also represent a separate transmitter and receivers.

The magnet 100 shows a first current lead 108 and a second current lead 110 connected to a current ramping system 624. The current ramping system 624 is shown as being connected to the hardware interface 628 of computer 626.

The magnetic field gradient coil power supply 612 and the transceiver 616 are connected to a hardware interface 628 of computer system 626. The computer system 626 further comprises a processor 630. The processor 630 is connected to the hardware interface 628, a user interface 634, computer storage 636, and computer memory 638.

The computer storage is shown as containing a fluorine magnetic resonance data 640. The magnetic resonance data 640 has been acquired by the magnetic resonance imaging system 600. The computer storage 636 is further shown as containing an image 642 which has been reconstructed from the magnetic resonance data 640. The computer storage 636 is further shown as containing a pulse sequence 648. A pulse sequence as used herein is a set of instructions which enables a magnetic resonance imaging system 600 to acquire magnetic resonance data 640.

The computer memory 638 is shown as containing a control module 650. The control module 650 contains machine executable instructions which enable the processor to control the operation and function of the magnetic resonance imaging system 600. For instance the control module may control the operation of the current ramping system. The control module 650 may use the pulse sequence 648 to generate commands which enable the processor 630 to acquire the magnetic resonance data 640. The computer memory 638 further contains an image reconstruction module 652. The image reconstruction module 652 contains computer executable code which enables the processor 630 to reconstruct the image 642 from the magnetic resonance data 640.

Figure 7:
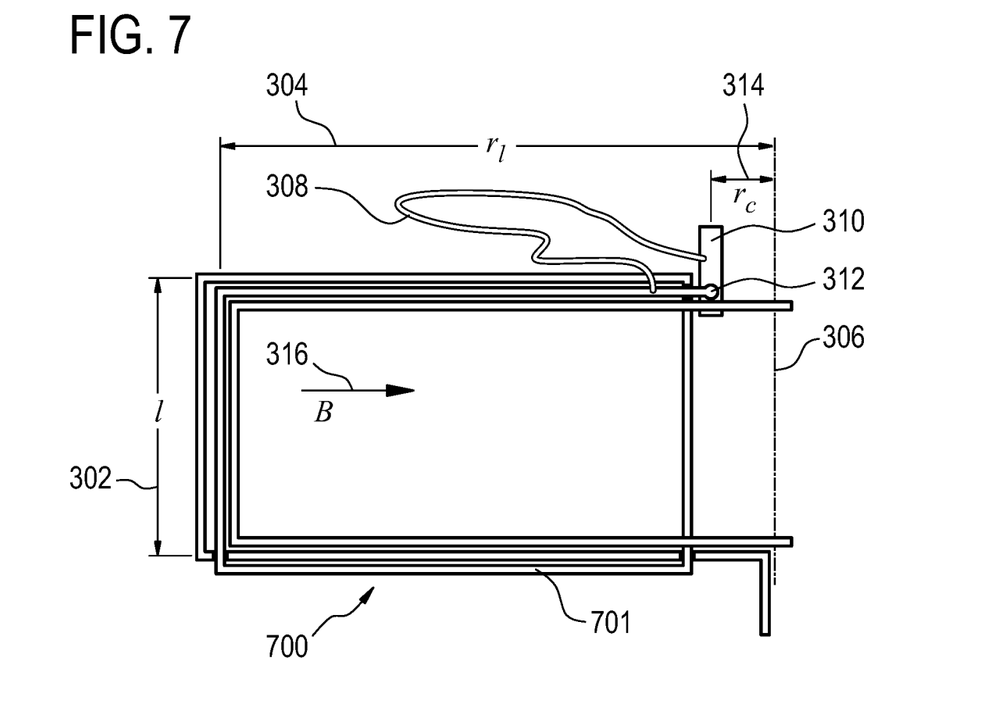
FIG. 7 illustrates an idealized switch assembly according to a further embodiment of the invention.

FIG. 7 shows an idealized switch assembly 700 according to an embodiment of the invention. The embodiment shown in FIG. 7 is similar to the embodiment shown in FIG. 3. Instead of the single rigid current loop 301 of FIG. 3, there is an additional coil loop that is used to form the rigid coil loop 701. In other embodiments, there may be more than one additional coil loop. The coil may be formed with additional windings of the coil 701.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A magnet for generating a magnetic field, wherein the magnet is a superconducting magnet, wherein the magnet comprises: a first current lead; a second current lead; a vacuum vessel, wherein the first current lead and the second current lead are located on an exterior surface of the magnet and penetrate the vacuum vessel; a magnet circuit for generating the magnetic field, wherein the magnet circuit is within the vacuum vessel; a first magnet circuit connection; a second magnet circuit connection, wherein the first magnet circuit connection and the second magnet circuit connection provide an electrical connection to the magnet circuit; a first switch for switching a first electrical connection between the first magnet connection and the first current lead; a second switch for switching a second electrical connection between the second magnet connection and the second current lead; a first current shunt connected across the first switch; a second current shunt connected across the second switch; a first rigid coil loop, wherein the first rigid coil loop is operable to actuate the first switch, wherein the first rigid coil loop forms a portion of the first electrical connection; a second rigid coil loop, wherein the second rigid coil loop is operable to actuate the second switch, wherein the second rigid coil loop forms a portion of the second electrical connection.

2. The magnet system of claim 1, wherein the first switch comprises a first pivot for pivoting the first rigid coil loop, wherein the first switch is formed by a first contact and a second contact, wherein the first rigid coil loop is operable for closing the first contact and the second contact by pivoting, wherein the second switch comprises a second pivot for pivoting the second rigid coil loop, wherein the second switch is formed by a third contact and a fourth contact, and wherein the second rigid coil loop is operable for closing the third contact and the fourth contact by pivoting.

3. The magnet of claim 1, wherein the first switch is formed by a first linkage comprising the first rigid coil loop, and wherein the second switch is formed by a second linkage comprising the second rigid coil loop.

4. The magnet of claim 1, wherein the first switch is formed by a first screw mechanism, wherein the first rigid coil is operable for actuating the first screw mechanism, wherein the second switch is formed by a second screw mechanism, and wherein the second rigid coil is operable for actuating the second screw mechanism.

5. The magnet of claim 1, wherein the first switch is thermally isolating, wherein the first switch is attached to the first current lead, wherein the second switch is thermally isolating, wherein the second switch is attached to the second current lead.

6. The magnet of claim 1, wherein the first switch is electrically connected to the first magnet connection with a first high temperature superconductor, and wherein the second switch is electrically connected to the second magnet connection with a second high temperature superconductor.

7. The magnet of claim 1, further comprising at least one restoring element operable for maintaining the position of the first rigid coil loop such that the first switch remains open and for maintaining the position of the second rigid coil loop such that the second switch remains open when the current flowing between the first current lead and the second current lead is below a predetermined threshold.

8. The magnet of claim 1, wherein the first rigid coil loop comprises multiple coil loops, and wherein the second rigid coil loop comprises multiple coil loops.

9. The magnet of claim 1, wherein at least one of the first rigid coil loop and the second rigid coil loop is attached to an iron block or wherein at least one of the first rigid coil loop and the second rigid coil loop is operable to move within a gap of multiple iron blocks attached within an interior surface of the vacuum vessel.

10. The magnet of claim 1, where the first switch comprises a first cold terminal electrically connected to the first magnet connection, where the second switch comprises a second cold terminal electrically connected to the second magnet connection, wherein the first cold terminal and the second cold terminal are thermally connected to a refrigerated radiation shield.

11. The magnet of claim 1, wherein the first switch and the second switch are mounted adjacent to a refrigerator stem for cooling the magnet circuit.

12. The magnet of claim 1, wherein the magnetic field has field lines, wherein the first rigid coil loop is orientated relative to the magnetic field lines such that a first predetermined switching current through the first rigid coil loop is operable for generating a first torque on the first rigid coil loop for actuating the first switch, wherein the second rigid coil loop is orientated relative to the magnetic field lines such that a second predetermined switching current through the second rigid coil loop is operable for generating a second torque on the second rigid coil loop for actuating the second switch.

13. The magnet of claim 1, wherein the magnet further comprises at least one heat shield at least partially surrounding and/or in contact with the first switch and the second switch.

14. A switch assembly for a superconducting magnet for generating a magnet field, wherein the magnet comprises: a first current lead; a second current lead; a vacuum vessel, wherein the first current lead and the second current lead are located on an exterior surface of the magnet and penetrate the vacuum vessel; a magnet circuit for generating the magnetic field, wherein the magnet circuit is within the vacuum vessel; a first magnet circuit connection; and a second magnet circuit connection, wherein the first magnet circuit connection and the second magnet circuit connection provide an electrical connection to the magnet circuit; wherein the switch assembly comprises: a first switch for switching a first electrical connection between the first magnet connection and the first current lead; a second switch for switching a second electrical connection between the second magnet connection and the second current lead; a first current shunt connected across the first switch; a second current shunt connected across the second switch; a first rigid coil loop, wherein the first rigid coil loop is operable to actuate the first switch, wherein the first rigid coil loop forms a portion of the first electrical connection; a second rigid coil loop, wherein the second rigid coil loop is operable to actuate the second switch, wherein the second rigid coil loop forms a portion of the second electrical connection.

15. The switch assembly of claim 14, wherein the first switch comprises a first pivot for pivoting the first rigid coil loop, wherein the first switch is formed by a first contact and a second contact, wherein the first rigid coil loop is operable for closing the first contact and the second contact by pivoting, wherein the second switch comprises a second pivot for pivoting the second rigid coil loop, wherein the second switch is formed by a third contact and a fourth contact, and wherein the second rigid coil loop is operable for closing the third contact and the fourth contact by pivoting.

16. The switch assembly of claim 14, wherein the first switch is formed by a first linkage comprising the first rigid coil loop, and wherein the second switch is formed by a second linkage comprising the second rigid coil loop.

17. The switch assembly of claim 14, wherein the first switch is formed by a first screw mechanism, wherein the first rigid coil is operable for actuating the first screw mechanism, wherein the second switch is formed by a second screw mechanism, and wherein the second rigid coil is operable for actuating the second screw mechanism.

18. The switch assembly of claim 14, wherein the first switch is thermally isolating, wherein the first switch is attached to the first current lead, wherein the second switch is thermally isolating, wherein the second switch is attached to the second current lead.

19. The switch assembly of claim 14, wherein the first switch is electrically connected to the first magnet connection with a first high temperature superconductor, and wherein the second switch is electrically connected to the second magnet connection with a second high temperature superconductor.

20. The switch assembly of claim 14, further comprising at least one restoring element operable for maintaining the position of the first rigid coil loop such that the first switch remains open and for maintaining the position of the second rigid coil loop such that the second switch remains open when the current flowing between the first current lead and the second current lead is below a predetermined threshold.

* * * * *